United States Patent [19]

Sadones

[11] Patent Number: 4,531,126
[45] Date of Patent: Jul. 23, 1985

[54] METHOD AND DEVICE FOR ANALYZING A VERY HIGH FREQUENCY RADIATION BEAM OF ELECTROMAGNETIC WAVES

[75] Inventor: Henri Sadones, Paris, France

[73] Assignee: Societe d'Etude du Radant, Les Ulis Cedex, France

[21] Appl. No.: 379,194

[22] Filed: May 17, 1982

[30] Foreign Application Priority Data

May 18, 1981 [FR] France .................. 81 09855

[51] Int. Cl.³ .............................................. G01S 7/40
[52] U.S. Cl. ............................. 343/17.7; 340/825.77; 343/754; 343/909
[58] Field of Search ................... 333/21 A, 21 R; 343/786, 754, 909, 17.7, 17.1 R; 340/825.77

[56] References Cited

U.S. PATENT DOCUMENTS

| | | | |
|---|---|---|---|
| 2,976,520 | 3/1961 | Reenstra | 340/825.77 |
| 3,708,796 | 1/1973 | Gilbert | 343/754 |
| 3,824,593 | 7/1974 | Baird | 343/17 |
| 3,825,931 | 7/1974 | Gonzalez et al. | 343/100 |
| 4,266,203 | 5/1981 | Saudreau et al. | 343/756 X |

FOREIGN PATENT DOCUMENTS 2088776 12/1976 Australia .
1473881 9/1965 France .

Primary Examiner—T. H. Tubbesing
Assistant Examiner—John B. Sotomayor
Attorney, Agent, or Firm—Pollock, VandeSande & Priddy

[57] ABSTRACT

The invention refers to the analysis of a very high frequency radiation beam of electromagnetic waves. According to the invention, a network of conductor wires is placed in the path of a beam to be analyzed, the wires being interrupted at intervals by switches. One controls the conducting state of a diode and one blocks the others and one makes the position of the diode vary electronically and sequentially in the conducting state. The return signal received on a sensor R is used by detecting the significant characteristics of that return according to the position of the diodes in the conducting state.

7 Claims, 3 Drawing Figures

METHOD AND DEVICE FOR ANALYZING A VERY HIGH FREQUENCY RADIATION BEAM OF ELECTROMAGNETIC WAVES

FIELD OF THE INVENTION

This invention relates to radar beam analysis and more particularly to a reflective diode matrix for returning a transmitted beam in a scan pattern.

BACKGROUND OF THE INVENTION

This invention mainly concerns a method and device for analyzing step by step the very high frequency radiation beam of electromagnetic waves received on a given surface. The invention applies especially to a beam of such waves transmitted by a very high frequency transmitting antenna.

Such studies are particularly needed to assemble and use transmitting antennae.

For such a study either one of the following two methods is called upon.

1. The radiation characteristics of the transmitting antenna are drawn up by using other receiving antennae arranged like the transmitting antenna on an outer testing base. This method can only be used to the extent that the transmitting antenna and the receiving antennae, which will make it possible to design the characteristics, are adequately spaced (for instance, for an antenna with a span of 50 wavelengths 5,000 times the wavelength, or 500 meters for frequencies equal to about 3000 MHZ). Also, the studies are valid under such circumstances only if the landscape profile is conducive. Also, the environment cannot trigger parasitic reflection phenomena which cause interference. It is obvious that such an analytical method runs against major infrastructural difficulties with respect to implementation. Moreover, this method is very time consuming, and it requires several hundred hours for drawing up the characteristics of a transmitting antenna.

2. In view of the tediousness of the above method, a method is developed presently to deduce the radiation characteristics of an antenna from measurements of the electromagnetic field conducted in the immediate vicinity of the antenna. This is an indirect method, and the field measurement is carried out by way of an extremely sensitive probe which moves in front of the antenna being measured. The probe itself can consist of an open guide or of a dipole.

The problems surface at the level of the mechanical displacement system of the probe and of its electrical connections with the measuring receiver, which trigger disruptive parasitic reflections which can be eliminated by protecting them from absorbing systems, which complicates the system and increases the clutter.

Furthermore, the measurements must be conducted in perfectly marked points: the mechanical displacement system of the probe must be extremely accurate.

However, the basic restriction in this method lies in the slowness of the mechanical displacement system of the probe.

In present systems, the speed does not exceed 10 centimeters/second. As regards the control of a very high frequency square antenna which operates at 3000 MHZ with a side of 50 wavelengths, measurement time is five hours.

The invention is designed to allow for rapid and accurate measurement in a very economical way which permits the study of the very high frequency radiation beam of electromagnetic waves received on a given surface and applies especially to the study of a beam of such waves radiated by a very high frequency transmitting antenna, which does not offer any of the disadvantages and restrictions of the two known methods mentioned above.

BRIEF DESCRIPTION OF THE INVENTION

The analytical method according to the invention is characterized in that there is on the path of said beam which is to be studied a network of conductor wires interrupted at different intervals by switches, such as diodes with at least two logical states (1, 0) for closed and opened switch conditions. This network is organized so that the greatest number of said elements can be controlled simultaneously in a first state (1) with a small and geographically assembled number of other "minority" elements in the other state (0). The position of said elements controlled in the zero state is changed sequentially and electronically to sweep most of the surface of the network, and the echo signal received by a sensor is received and used by detecting the significant characteristics of that echo in function each time, of the position of said elements in small numbers. Fortunately, in order to refine the measurement and to be released from ambient "noise," the current that crosses said minority elements is modulated so as to obtain a modulated echo signal in a more distinguishable correspondence.

The study of the beam can be conducted at all points of its path, for instance at close proximity to a transmitting antenna if the analysis involves the transmitting beam from that antenna. The "probe" is comprised according to the invention by "minority" elements that are physically static. The displacement of this "probe" can take place very quickly since the control of positions for those minority elements is an electronic control that performs, for instance, a line, columnar or other type of scan. Therefore, the restriction is only based on the blocking or unblocking control speed of the diodes in the event that the controllable switches are made of such diodes. This makes it possible to multiply by more than a factor of a hundred the analysis speed of a very high frequency beam of electromagnetic waves in relation to the speed of the fastest conventional methods.

One also understands that the invention can find numerous instant applications not limited to the single study of the transmitting beam of an antenna. For instance, the invention can apply to "radiography" for very high frequency waves of any body subjected to such radiation, such "radiographies" applied both in industry and in the medical and surgical fields.

The findings of the study can be translated according to conventional electronic methods known by those skilled in the art into data tables that are ultimately processed by a computer, into curves or even into three-dimensional surfaces.

Practically speaking, in order to permit a finer measurement, the amount of "minority" elements shall be selected to equal one.

The invention also targets a device that makes possible the implementation of the abovementioned method, this device characterized in that it includes:

two networks of crossed wires, that are for instance substantially orthogonal, of conductor wires that form a field gridded with opposing meshes, a segment of wires connected inside each mesh to a couple of two crossed conductor wires that differ from one mesh to the next, a switch like a diode on each one of said segments, arranged fairly to the middle of the controllable part of the segment that parallels the electrical field vector of the very high frequency wave, an electronic switch which can sequentially feed each said element or a small number of them from said networks in succession, in order to control it at the zero state and all the other elements at state 1.

According to a preferred arrangement, the wire segments are in an L shape, of which the branch supporting the switch is parallel to the electric field vector of the very high frequency wave and the extremities of which are connected to two conductor wires that form two sides of each mesh.

Fortunately, the conductor wires are arranged according to two networks of parallel wires, that are orthogonal from one network to the next, respectively on each side of a support plate, advantageously made of a dielectric material, said segments located on one of the sides of said plate and the holes shaped through said plate ensuring the electric connection from mesh to mesh in each segment with one of the conductor wires of the wire network located on the other side of the plate.

The invention and its implementation will be clearer with the following description serving as a reference to the attached drawings providing only as an illustration of one implementation mode.

DETAILED DESCRIPTION OF THE INVENTION

Figure 1:
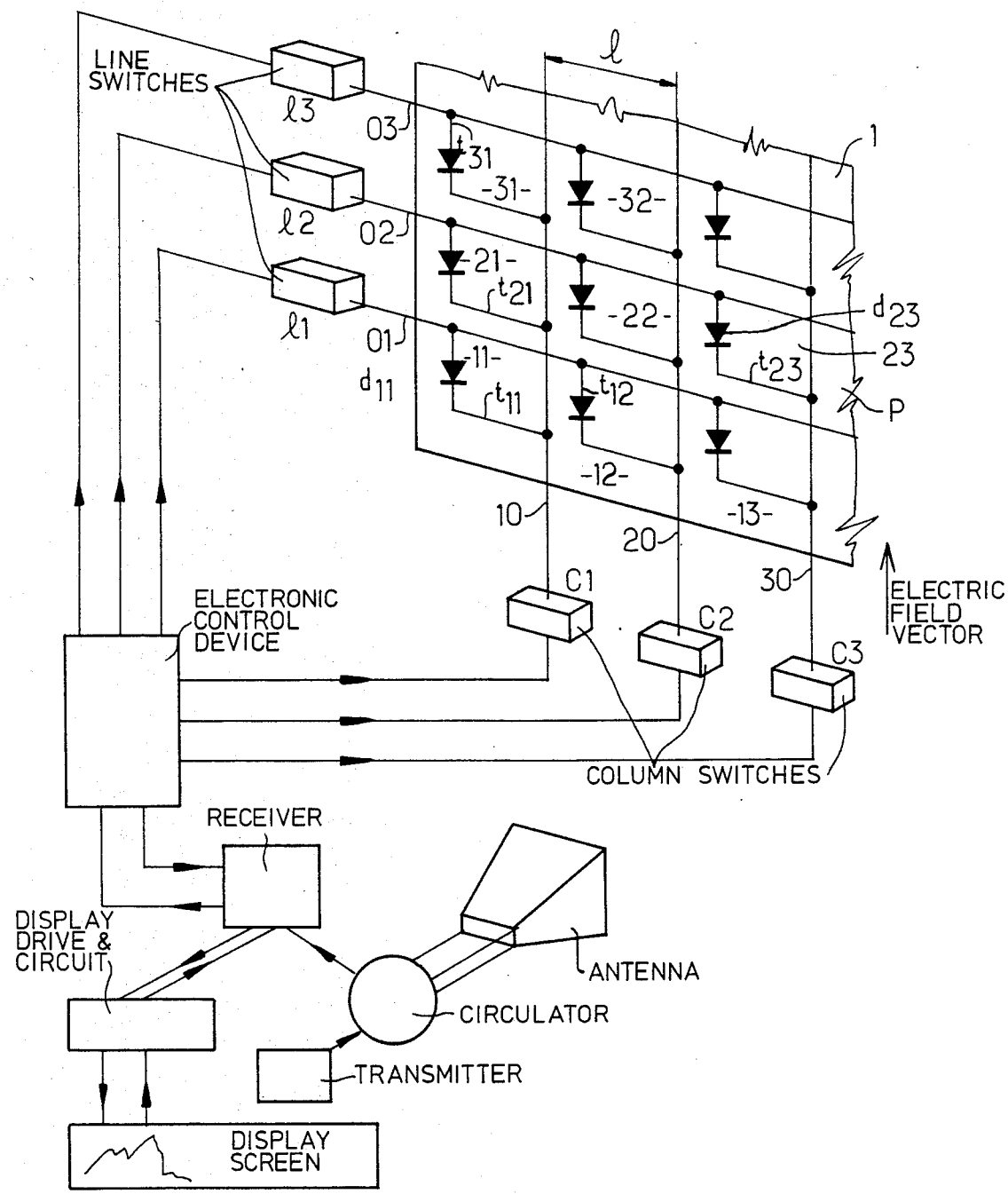
FIG. 1 is a schematic view of the entire device for analyzing a very high frequency radiation beam of electromagnetic waves, with only a fraction of the analytical panel being represented.

According to the implementation and application mode shown in the drawings, the analysis centers on the very high frequency radiation beam of electromagnetic waves emitted by an antenna T. To this end, the beam emitted by the antenna T is directed toward a panel P according to the invention which permits the analysis step-by-step of the beam as it will be explained hereafter. The panel can be placed quite close to the antenna.

The panel P includes two networks of orthogonally crossed wires, forming a matrix as appears in FIG. 1. An initial network of parallel wires 01, 02, 03 . . . is arranged on one side of a plate that forms a dielectric panel 1 (see FIG. 2), while a second network orthogonal to the first, includes parallel wires 10, 20, 30 . . . arranged on the other side of that same plate 1. Therefore, there is no direct electric contact between those wires, which can be formed on each side of the dielectric panel 1, for instance with a printed circuit technique. In FIG. 1, the crossing points between the wires, for example, such as between 02 and 10 are therefore not electric contact points for those wires.

The two networks of orthogonal wires thus divide the surface of panel P into square meshes that is uniquely identified by a number composed of two digits, the first which gives the number of the upper row that forms a border of the mesh and a second digit that gives the number of the column that forms a border of the same mesh. Thus, one may locate in the figure the meshes 11, 12, 13 . . . 21, 22 . . . 31, 32 . . . .

According to the invention, in each of the meshes, there is a segment of wire such as $t_{11}$, $t_{12}$ . . . $t_{21}$ . . . conductor wires, which connects a line of a network to a column from another network. In the accurate assembly shown in FIG. 1, the electric connections indicated by points are achieved between each segment that bears the reference of the mesh inside which it is included. Thus, for example, segment $t_{23}$ is included between the mesh 23 and is connected to line 02 and to column 30, the mesh 23 bound by lines 01 and 02 (upper row) and by columns 20 and 30 (upper row).

The different segments of t wires, such as the segment $t_{23}$ for instance, are arranged on one side of the panel, for instance on the side that carries the network of lines 01, 02, etc. Those segments can be printed by a conventional printed circuit technique. The electric contact of the segments with the lines such as those indicated with a point in FIG. 1 is achieved easily since those wires are in the same plane on the same side of panel 1. An electric contact in FIG. 3 is shown at a junction 2.

Figures 2, 3:
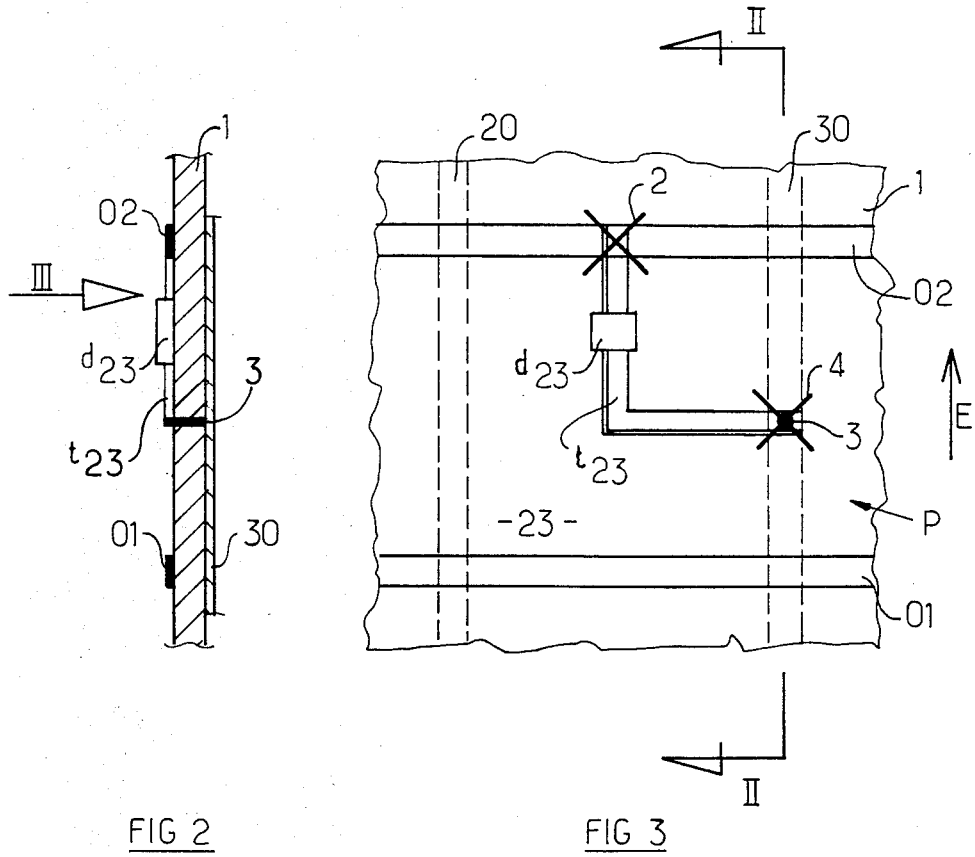
FIG. 2 is a sectional view substantially along plane II—II of FIG. 3 of a fraction of the analytical panel.
FIG. 3 is a view of a portion of the same panel, in the direction of arrow III of FIG. 2.

The electric contacts of the segments with the network columns which are arranged on the other side of the panel are shaped by feed-thru metal eyelets 3 (FIGS. 2 and 3) which cross through the panel 1 thus enabling electric contact at point 4 as shown by the cross in FIG. 3.

Thus, each segment of wires $t_{np}$ can be uniquely connected inside the mesh np in which it is included.

As shown in the drawings, the segments form an L shape of which the branches take up most of the middle of the meshes.

According to a basic characteristic of the invention, on each segment $t_{np}$ a switch, preferably in the form of a diode, is mounted close to the middle of the segment section and is oriented parallel to the indicated field E. Each switching diode "d" is referenced by the same number as its corresponding mesh.

If a line switch $l_1$, $l_2$, $l_3$, etc. is placed on each line of the first network and a column switch $c_1$, $c_2$, $c_3$, etc. on each column of the other network, and if those switches are connected to an electronic control device A, it is possible to generate, through each segment, a current having a specific level and all the segments can carry fairly strong currents of several milliamps which correspond to the saturation current of the diodes "d". For the invention to operate, one or a small number of segments receive no current due to the blocking of corresponding diodes through the application of a reverse voltage. Conversely, one can apply a reverse blocking voltage for the diodes on all the segments, except for one or a small number of them.

There follows a description of the ways in which the panel of the invention is used to conduct the analysis of the beam radiated by the antenna T, of which the electric field vector is referenced as $\vec{E}$.

Firstly, in order to ensure refinement in the measurement, the pitch of meshes l is preferred lower than the wavelength of the analyzed beam, and preferably lower than one fourth of that wavelength. For instance, with respect to a beam analysis with emission at approximately 3000 MHZ, a mesh pitch of approximately two centimeters is adopted.

In such an instance, it should be noted that any wire segment directed parallel to the electric field vector $\vec{E}$ with a length smaller or equal to the length of the critical dimension λ/2 forms a resonant dipole which interferes and reflects the incident very high frequency electromagnetic wave as it increases. Under those circumstances, the wire segments on which the diodes are conducting will reflect more significantly the very high frequency incident beam than the wire segments on which the diodes are blocked and on which two electromagnetically equal dipoles with half lengths are more "transparent" to the beam than a dipole with a double length.

If the measurement is conducted as a reflection, a reverse diode blocking voltage of all the segments will be applied, except for that of segment $t_{np}$ of np mesh. In that mesh for which diode $d_{np}$ is conducting, the dipole formed by the part which is parallel to the electric field $\overline{E}$ of segment $t_{np}$ will induce a more significant reflection on the very high frequency beam of waves than that induced by the other segments of the blocked diodes which appear more "transparent" for the incident beam.

A panel like P is placed in front of a transmitting antenna T. The antenna is connected to a transmitter E, a receiver which receives the return signal R and a circulator C which makes possible the reception of the reflected signal after each transmittal period.

The receiver is connected to a device A which includes the control electronics that make it possible to alter in succession the voltage applied to lines 01, 02, etc., and to the columns 10, 20, 30, etc. by way of line switches $l_1$, $l_2$, $l_3$, etc. and column (switches) $c_1$, $c_2$, etc. turn on one diode $d_{np}$ of the network at any instant. One can use a line and/or column scan, for instance similar to the scan of a television screen to successively turn on all the diodes.

As an example, to make the diode $d_{23}$ conductive from wire 02 to wire 30 while blocking all other diodes, one applies the following voltage to the lines and columns of the network:

voltage on line 02: 50 volts,
voltage on column 30: 25 volts,
voltage on the other network lines $l_1$, $l_3$, etc: 0 volt,
voltage on the other columns of the network $c_1$, $c_2$, $c_4$, etc: 75 volts.

Then, it is adequate to record and store the returned signals received by the receiver in relation to the position of each resonant dipole which permits the accurate localization of the panel on which the analyzed beam is received.

The findings can be obtained in the form of data tables that especially give the magnitude and received signal phase according to the coordinates of the "reflecting" point of panel P. One can also obtain a direct image of those values by using a circuit F that drives a display screen S of a cathode ray tube.

From the previous description, it is clear that the scanning speed of panel P is only limited by the response time of blocked diodes. Because those time frames are very short (about several nanoseconds), the scan can be conducted very quickly, and the measurement is more than 100 times faster than that permitted by the abovementioned prior art means.

The returned signal or field re-radiated by the dipole is weak, and one preferably modulates the signal by applying a modulated voltage in direct-reverse pulses to the diode of the involved dipole. Thus, the reradiated field is also modulated as well as the signal at the receiver input, which makes it possible, with synchronous detection, to distinguish clearly the return signal from parasitic "background noise."

In order to proceed with a fast measurement, one will select a diode modulation frequency of 100 KHZ for instance, which allows enough time to measure 1 millisecond. The dipole displacement is conducted with electronic switching, the number of punctual measurements reaching as many as 1000 per second.

There are many applications of the invention.

First of all, the invention makes it possible to substitute the abovementioned known methods of analysis of a beam radiated from an antenna.

The invention also makes it possible to conduct "X-rays or photographs" of various bodies subjected to a very high frequency beam of electromagnetic waves. Such X-ray photos can be applied especially in the fields of medicine and biology. The extremely fast method of measurement can allow for "instantaneous results" without the examined patient having to be subjected to a significant dose of radiation which may not be usually bearable.

The invention is not all limited to the illustrated implementation mode which has been described and only provided as an example, since the invention actually embodies all the technical equivalencies of the described means as well as their combinations if the latter were to be carried out in the spirit thereof and implemented within the framework of the invention.

Thus, if one wishes to obtain a more significant return signal, one can group the "minority" elements that are blocked, in small numbers of geographically assembled and neighboring elements that give rise to measurement signals, which, in some cases, can be easily employed by generating images with more powerful and more dispersed spots.

If one wishes to analyze step by step the incident beam with a measurement of the electromagnetic field at emission and not of the re-radiated field, all one needs to do is to reverse all of the voltage controls to the line and column terminals of the panel and thus render transparent, only to the incident beam on the panel, the new generated minority element.

Therefore, the measurement of this modulated emitted field previously designated is recorded by an additional receiver placed behind the panel and is therefore distinct from the transmitting antenna this time.

This device uses the same wire network as before and an additional receiver or ultimately as many additional receivers as there are transparent np meshes successively in the network, placed facing the latter. Thus, it could be more interesting to conduct medical or biological X-ray photographs with the higher measurement sensitivity that it provides.

Also, one can mount on each $t_{np}$ segment several diodes in $d_{np}$ series in order to have dipoles that are still smaller therefore transparent in a diode blocking system.

It should be understood that the invention is not limited to the exact details of construction shown and described herein for obvious modifications will occur to persons skilled in the art.

I claim:

1. In an antenna beam analyzing system, a selectively reflective structure positioned in confronting relation to an antenna and comprising:

a first plurality of coplanar conductors disposed in parallel spaced relation;

a second plurality of coplanar conductors disposed in parallel spaced relation to each other and respectively orthogonal to the first conductor plurality so that the conductors form a matrix configuration having individual contiguous mesh-like units;

means mounting the planes of the first and second conductor pluralities in spaced non-contacting relation;

a diode array including individual diodes uniquely connected between a conductor of the first plurality and a conductor of the second plurality, each diode oriented parallel to the electric field of the antenna beam; and means for individually switching a small number of adjacent diodes to a first state while switching the remaining diodes to a second state, the switching means further addressing a different small number of diodes during sequential intervals in a predetermined pattern causing changing corresponding return signals to the antenna.

2. The structure set forth in claim 1 wherein the first and second conductor pluralities are printed on opposite sides of a circuit board, and further wherein "feed-thru" conductor means are provided for connecting individual diodes to respective conductors of the first and second conductor pluralities 3. A method for analyzing a radar beam comprising the steps:

forming a first plurality of coplanar conductors disposed in parallel spaced relation;

forming a second plurality of coplanar conductors disposed in parallel spaced relation to each other and respectively orthogonal to the first conductor plurality so that the conductors form a matrix configuration having individual contiguous mesh-like units;

mounting the planes of the first and second conductor pluralities in spaced non-contacting relation;

forming a diode array including individual diodes uniquely connected between a conductor of the first plurality and a conductor of the second plurality, each diode oriented parallel to the electric field of the antenna beam;

individually switching a small number of adjacent diodes to a first state while switching the remaining diodes to a second state; and addressing a different small number of diodes during sequential intervals in a predetermined pattern causing changing corresponding return signals to the antenna.

4. The method set forth in claim 3 together with the step of printing the first and second conductor pluralities on opposite sides of a circuit board; and forming "feed-thru" conductor means through the board for connecting individual diodes to respective conductors of the first and second pluralities.

5. The method set forth in claim 3 together with the steps of:

receiving return signals from the interconnected conductors and diodes; and storing the returned signals for analysis of each return as a function of the correspondingly addressed diodes.

6. The method set forth in claim 3 together with the step of modulating a current through addressed diodes to obtain correspondingly modulated return signals.

7. The method set forth in claim 4 together with the steps of:

receiving return signals from the interconnected conductors and diodes;

storing the returned signals for analysis of each return as a function of the correspondingly addressed diodes;

modulating a current through addressed diodes to obtain correspondingly modulated returns; and wherein the dimension between adjacent conductors of the first plurality is smaller than the wavelength of the antenna beam undergoing analysis.

* * * * *